United States Patent
Ludwig et al.

(10) Patent No.: US 6,917,197 B2
(45) Date of Patent: Jul. 12, 2005

(54) DEVICE FOR ADJUSTING AN OPERATING POINT OF A MAGNETIC FIELD SENSOR

(75) Inventors: Christoph Ludwig, Constance (DE); Wolfgang Ludwig, Tägerwilen (CH)

(73) Assignee: STL Systemtechnik Ludwig GmbH, Constance (DE)

( * ) Notice: Subject to any disclaimer, the term of this patent is extended or adjusted under 35 U.S.C. 154(b) by 0 days.

(21) Appl. No.: 10/487,267

(22) PCT Filed: Aug. 7, 2002

(86) PCT No.: PCT/EP02/08799
§ 371 (c)(1),
(2), (4) Date: Feb. 19, 2004

(87) PCT Pub. No.: WO03/019214
PCT Pub. Date: Mar. 6, 2003

(65) Prior Publication Data
US 2004/0207397 A1 Oct. 21, 2004

(30) Foreign Application Priority Data
Aug. 20, 2001 (DE) .......................... 101 39 883

(51) Int. Cl.[7] .......................................... G01R 33/035
(52) U.S. Cl. ...................................................... 324/248
(58) Field of Search .............................. 324/244, 260, 324/248; 505/160, 162, 190–193, 845, 846

(56) References Cited

U.S. PATENT DOCUMENTS 4,672,359 A  6/1987 Silver
6,320,369 B1 * 11/2001 Hidaka et al. .......... 324/117 R
6,337,567 B1 *  1/2002 Lee et al. ................... 324/248

OTHER PUBLICATIONS

C. Ludwig et al., Versatile High Performance Digital SQUID Electronics, IEEE Transactions on Applied Superconductivity, Mar. 2001, pp. 1122–1125, vol. 11, No. 1, Virginia Beach.

* cited by examiner

Primary Examiner—Bot LeDynh
(74) Attorney, Agent, or Firm—Bachman & LaPointe, P.C.

(57) ABSTRACT

The invention relates to a device for setting an operating point of a magnetic field sensor having a periodic characteristic, in particular for a device for detecting a magnetic field and/or flux, having a SQUID as magnetic field sensor and a control unit which is connected downstream of the SQUID, has a control time constant (t) and has a feedback loop which acts on the SQUID and is designed such that it is active about a number of operating points of the SQUID, where flux quantum pump means are provided which are assigned to the SQUID, have a signal generation unit for generating a control and/or regulation signal for the SQUID and are designed such that, in order to pump at least one flux quantum into and out of the SQUID, a signal form of the control and/or regulation signal, generated by the signal generation unit, is different and, referred to a rising and a falling edge of a signal form, is unsymmetrical, where in each case only one of the edges of a signal form is short referred to the control time constant.

12 Claims, 2 Drawing Sheets

DEVICE FOR ADJUSTING AN OPERATING POINT OF A MAGNETIC FIELD SENSOR

The present invention relates to a device according to the preamble of patent claim 1. Such a device is known for example from the German Laid-Open Specification 196 06 655 A1 and has, as essential magnetic measurement element, a SQUID which is held at a fixed operating point by a control loop (FLL=Flux Locked Loop).

The problem which underlies the cited generic prior art in magnetic flux measurement by means of SQUID can be illustrated with reference to the signal diagram shown schematically in FIG. 4 (flux $\theta$ as input parameter, output signal U of the SQUID electronics): The output signal is periodic with spacings of a flux quantum $\theta_0$, so that the measurement and compensation in particular of highly fluctuating measured signals is problematic; as can be clearly seen from FIG. 4, the analog flux control illustrated by the control loop in particular including in FIG. 1 of DE 196 06 655 operates linearly only within an input signal range of half a flux quantum.

This problem is solved by the cited specification from the prior art in that the analog control loop is additionally supplemented by a digital control component, so that the counting of the flux quanta of the overall arrangement is unambiguous and no flux quanta are lost. A resetting of the flux quanta is effected, according to this prior art, by opening the analog control loop or by means of a so-called clamping device.

Nevertheless, in practical operation, in particular during use in unshielded environments and in the case of rapidly changing measured signals, the operation of a generic, hybrid technology (that is to say one which has analog and digital control elements) is not without problems: the low slew rates provided on account of the system are exceeded even in the case of highly magnetic interfering influences, and the slow resetting of the generic technology prevents it from being possible to follow rapidly changing measured signals.

In addition, the rapid signal changes bring about control deviations in the control unit used, and these control deviations cause measurement inaccuracies.

It is therefore an object of the present invention to develop a generic device for setting an operating point with respect to its usable bandwidth and/or the usable control range to the extent that it is possible to compensate, reliably and without delay, in particular even over a measurement range comprising a number of flux quanta. Accordingly, a device is to be provided which can be reliably operated even in environments having high magnetic control influences and/or insufficient shielding conditions.

The object is achieved by the device having the features of patent claim 1 and by the method having the features of patent claim 10; advantageous developments and inventions are described in the subclaims.

In an advantageous manner according to the invention, the flux quantum pump means ensure that, without there being any need to fear control influences of the control unit, it is possible for flux quanta to be pumped into and out of the SQUID by the signal generation unit using characteristic signal forms, as a result of which the control range accordingly expands by this possible number of flux quanta.

In particular, the short edge according to the invention (rise in the case of pumping in, fall in the case of pumping out) means that, by comparing short edge durations with the control time constant of the control unit, the control loop cannot follow this signal change and hence does not compensate the quantum flux signal; this then leads (cf. FIG. 4), by virtue of the pumping, to a period-based or flux quantum-based movement over the periods and hence over the $\theta_0/2$ control range of the traditional control loop being possible.

As a result, the analog flux control is possible in an uninterrupted manner, that is to say the dead times or delay times for the digital setting and resetting means, which are known from the prior art and needed therein, do not occur, so that in an advantageous manner according to the invention the device according to the present invention is also able without any problems to follow rapid signal changes of an input signal that is to be measured and moreover also allows considerably higher slew rates.

Particularly in the case of pumping out, the resetting known from DE 196 06 655, which is effected by opening the control loop, is thus unnecessary; rather, a flux quantum is accordingly pumped out (or pumped in) in particular when the amplitude of the flux pulse generated by the flux quantum pump means or the associated signal generation unit is greater than a flux quantum. Dead times are avoided.

It has proven to be particularly preferred to configure the unsymmetrical signal forms according to the invention, for bringing about the pumping in or out, in a triangular manner, where either (in each case compared to the control time constant) a short rising edge lies opposite a long falling edge or, in the case of pumping out, a short falling edge follows a slow rising edge.

In the preferred design embodiment, the signal generation unit according to the invention, which otherwise in a known manner generates the signal or pulse forms according to the invention, is coupled into the flux control loop, and in particular the control or regulation signal generated according to the invention acts on the voltage flux converter means assigned to the flux control loop, which voltage flux converter means are typically embodied as a coil and generate the desired flux signal for SQUID from a current or voltage signal. As a result, there is thus a closed control loop which overcomes in particular the disadvantages of the hybrid control loop described above from the generic prior art, said prior art control loop not being completely closed, and in particular, for the reasons described above, does not require any opening or suchlike measures of a control loop for resetting purposes, as is required in the prior art.

In the practical embodiment, it has additionally been proven to be preferred for the PID controller provided according to one development to be configured with a typical difference or servo amplifier, which is used in a known manner to generate the measured or useful signal; in an advantageous manner according to one development, an integrator formed in this way is also designed for higher than the first order. This then also leads to it being possible to avoid the inaccuracies in the measurement response—brought about by rapid signal changes—and additionally to it being possible to detect greater flux change rates.

A number of current SQUID devices are suitable for use in the context of the present invention, for instance the rf-SQUID or dc-SQUID which are otherwise known, having two or more Josephson contacts.

In particular, it is also within the scope of the present invention to configure the signal form according to the invention for pumping in or pumping out such that more than one flux quantum is pumped with one signal pulse; this preferably takes place by correspondingly configuring the amplitude of the signal.

It is also within the scope of the present invention to assign to the control unit according to the invention, besides analog control means, also digital control means, so that a hybrid flux control loop can also be formed within the context of the invention. By contrast with the prior art, however, the flux quantum pump means provided according to the invention are a direct part of the hybrid flux control loop and thus permit independent and in particular also delay-free operation of the analog and digital control means.

As a result, compared with the prior art, there is thus a considerably improved arrangement having an actuator, which still allows reliable and interference-free measurement operation particularly in measurement environments with unfavorable shielding or in the case of very rapid and pronounced signal changes of the measured signal. The present invention can surprisingly be implemented in a simple manner with a low outlay on design.

Further advantages, features and details of the invention emerge from the following description of preferred examples of embodiments and with reference to the drawings, in which.

Figure 1:
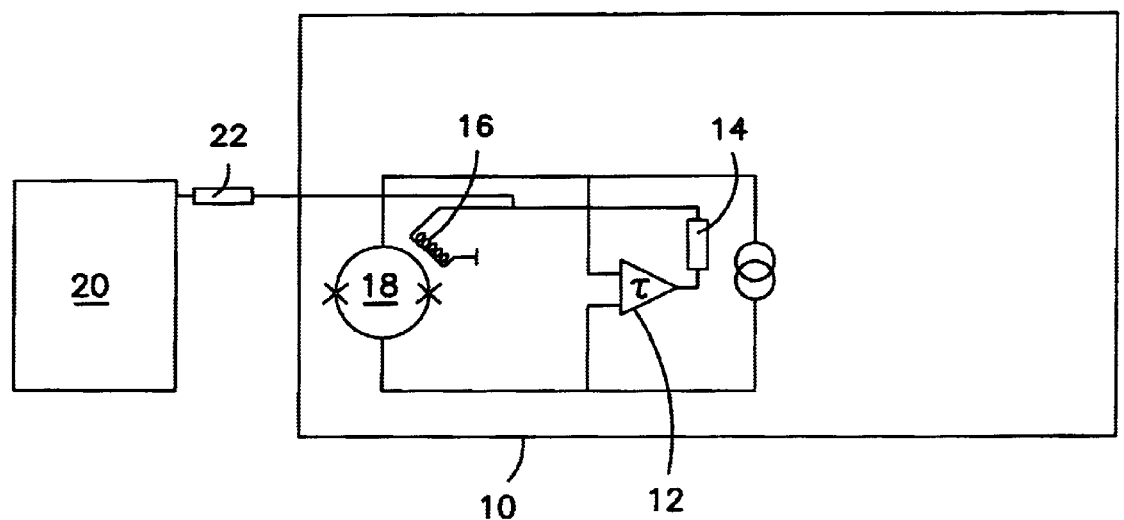
FIG. 1 shows a schematic block diagram of the present invention according to a first preferred embodiment.

FIG. 1 schematically shows the design and functioning of the present invention. A control unit delimited schematically by the boundary line 10 has, in a known manner, a servo or difference amplifier 12 which is assigned to a SQUID 18, generates a feedback signal as reaction to a signal difference on the SQUID and leads a feedback coil 16 over a coupling resistance, which feedback coil then, with a control time constant t inherent in the control unit, allows compensation of the detected signal change by generating a corresponding compensation flux. To this extent, the arrangement shown corresponds to the control loop arrangement shown in FIG. 1 of DE 196 06 655 A1, to which reference is hereby made for further details of the practical embodiment and which allows the person skilled in the art to readily implement it in practical terms.

In an inventive manner, the control loop now additionally has assigned to it a signal generation unit 20 as flux quantum pump which, again over a schematically illustrated coupling resistance, provides the feedback coil 16 with a flux quantum pump signal or a pump pulse which according to the invention is formed to pump a flux quantum into or out of the SQUID 18 and by virtue of its characteristic signal form, as will be described below, remains uninfluenced through the control loop.

Figure 2:
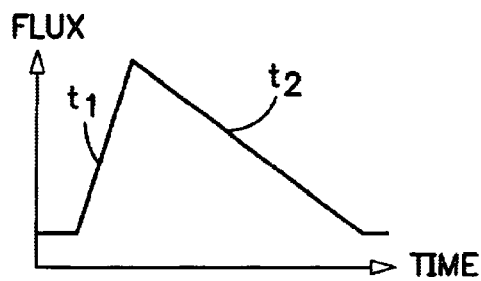
FIG. 2 shows a signal diagram of an unsymmetrical signal form generated by the signal generation unit in FIG. 1, for pumping a flux quantum into the device.
Figure 4:
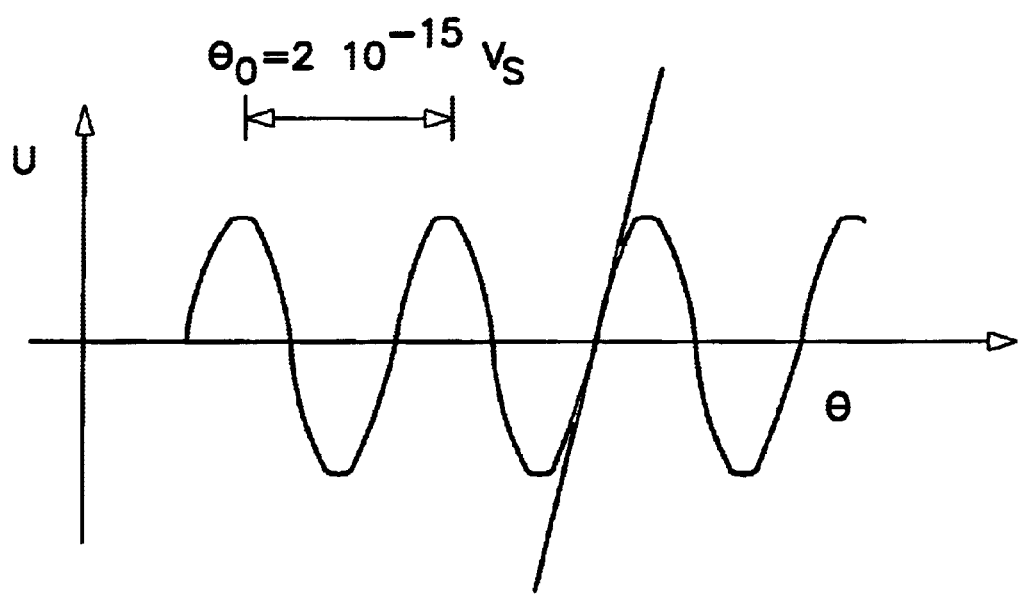
FIG. 4 shows a general signal diagram which illustrates the connection between magnetic flux as input signal or measured signal of a SQUID and the output voltage signal U which is periodic with a flux quantum $\theta_0$.

In more precise terms, the signal form generated by the signal generation unit 20, for pumping in one (or more) flux quantum(quanta), has an unsymmetrical contour in the flux/time diagram of FIG. 2 and is configured such that the rise time $t_1$ of the rising edge in the pump signal is short referred to the control time constant of the control loop 10; by contrast, the duration of the falling edge $t_2$ of the pump signal shown in FIG. 2 is long compared to the control time constant t. This means that, by applying to the feedback coil 16 a signal having the pulse form shown in FIG. 2, the control loop 10 cannot follow the steep edge rise $t_1$ of the rising edge, and hence the control loop therefore cannot compensate the additional flux rise brought about by the control signal; this then leads to the signal jumping to the right by one flux quantum in the signal diagram in FIG. 4, and to this extent the control unit which additionally has the flux quantum pump can follow the signal also over the signal width up to now of only half a flux quantum. The falling edge shown in FIG. 2 is by contrast in turn compensated by the control loop within the control time constant, so that the SQUID remains at the increased quantum flux level.

In practice, rapid rise times in the region of about 10 ns can thus be implemented, with the fall times typically being greater by a factor of 2. In order to obtain and transmit neat signal forms also in these ranges, lines adapted for high frequency are furthermore preferably provided according to the invention.

Figure 3:
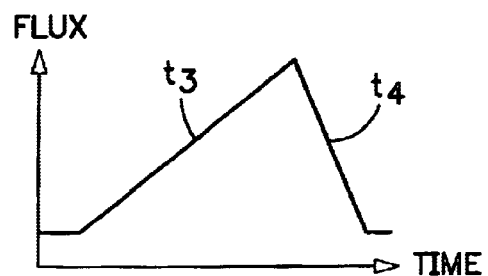
FIG. 3 shows a signal diagram similar to FIG. 2, for pumping a flux quantum out of the SQUID

FIG. 3 describes the case that is similar to but the reverse of FIG. 1 and thus a pumping of a flux quantum out of the SQUID. The rising edge, which is controlled with a slow rise time $t_3$, is compensated by the control loop, but the falling edge which is short at $t_4$ is too short for a reaction of the control loop having a control loop constant t, so that a flux quantum is pumped out of the SQUID.

By virtue of these two modes, the possibility is in particular provided of achieving a predetermined setting of the SQUID to an operating point of the periodic characteristic in a simple and above all interruption-free manner, something which traditionally could only take place by opening the analog control loop with the time drawbacks brought about thereby (cf. the generic prior art). In an otherwise known manner, an analog control unit provides the information required for the setting.

While the example of embodiment described firstly describes the movement by in each case individual flux quantum steps by the flux quantum pump according to the invention, the present invention is not restricted to the pumping in and out of individual flux quanta but rather the simultaneous pumping of a number of flux quanta in both directions is possible in particular by virtue of a suitable (amplitude) configuration of the control signals in a manner analogous to FIG. 2 and FIG. 3.

Key to Figures
Fluss=flux
Zeit=time

What is claimed is:

1. A device for setting an operating point of a magnetic field sensor having a periodic characteristic for detecting a magnetic field and/or flux, having a SQUID as magnetic field sensor and a control unit connected downstream of the SQUID, the control unit comprising a control time constant (t) and a feedback loop which acts on the SQUID and is active about a number of operating points of the SQUID, a flux quantum pump means assigned to the SQUID, and having a signal generation unit for generating a control and/or regulation signal for the SQUID in order to pump at least one flux quantum into and out of the SQUID, a signal form of the control and/or regulation signal, generated by the signal generation unit, is different and, referred to a rising and a falling edge of a signal form, is unsymmetrical, where in each case only one of the edges of a signal form is short referred to the control time constant.

2. The device as claimed in claim 1, wherein the signal generation unit is designed such that, in order to pump the at least one flux quantum in, the signal form has a rising edge with a rise time (t1) that is short with respect to the control time constant (t) and a falling edge with a fall time (t2) that is long with respect to the control time constant.

3. The device as claimed in claim 1, wherein the signal generation unit is designed such that, in order to pump the at least one flux quantum out, the signal form has a rising edge with a rise time (t3) that is long with respect to the control time constant and a falling edge with a fall time (t4) that is short with respect to the control time constant.

4. The device as claimed in claim 1, wherein voltage flux converter means, for the SQUID is connected downstream of the signal generation unit, where the voltage flux converter means is also connected downstream of the control unit and acts as part of the feedback loop.

5. The device as claimed in claim 1, wherein the flux quantum pump means form a closed control loop with the signal generation unit and the control unit.

6. The device as claimed in claim 1, wherein the control unit has a servo amplifier which acts as a $PI^N$ or $PI^N$ D controller, where $N \geq 1$, which servo amplifier is designed to process also integrators of higher than the first order.

7. The device as claimed in claim 1, wherein the SQUID has an rf-SQUID and/or a dc-SQUID, which has more than two Josephson contacts.

8. The device as claimed in claim 1, wherein the signal generation unit is designed such that the signal form can be generated and configured such that more than one flux quantum is pumped into or out of the SQUID.

9. The device as claimed in claim 1, wherein the device has analog and digital control means for configuring a hybrid flux control loop over the entire range of the characteristic of the SQUID, where the flux quantum pump means is set up as part of the hybrid flux control loop such that independent operation of the analog and digital control means is permitted.

10. A method of pumping at least one flux quantum into and out of a SQUID wired to a control loop, where the control loop has a control time constant (t) and acts on the SQUID and is designed such that it is active about an operating point of the SQUID, characterized by the steps:

generation of a control and/or regulation signal for the pumping in, having a first signal form which has a rising edge that is short with respect to the control time constant and generation of a control and/or regulation signal for the pumping out, having a second signal form which has a falling edge that is short with respect to the control time constant.

11. The method as claimed in claim 10, wherein the generation of the control and/or regulation signal comprises the introduction of a current signal into a feedback coil which is part of the control loop.

12. The method as claimed in claim 10, wherein the control range of the control loop is set by the control and/or regulation signal such that an analog control range is made possible over a number of flux quanta.

* * * * *